(12) United States Patent
Bowen et al.

(10) Patent No.: US 11,986,848 B2
(45) Date of Patent: May 21, 2024

(54) ACOUSTIC DROPLET EJECTION

(71) Applicant: TTP Plc, Royston (GB)

(72) Inventors: Wayne Bowen, Royston (GB); David Pooley, Royston (GB)

(73) Assignee: TTP Plc, Royston (GB)

( * ) Notice: Subject to any disclaimer, the term of this patent is extended or adjusted under 35 U.S.C. 154(b) by 910 days.

(21) Appl. No.: 16/966,168

(22) PCT Filed: Jan. 31, 2019

(86) PCT No.: PCT/GB2019/050269
§ 371 (c)(1),
(2) Date: Jul. 30, 2020

(87) PCT Pub. No.: WO2019/150117
PCT Pub. Date: Aug. 8, 2019

(65) Prior Publication Data
US 2021/0039128 A1    Feb. 11, 2021

(30) Foreign Application Priority Data

Feb. 2, 2018  (GB) ..................................... 1801712

(51) Int. Cl.
| | |
|---|---|
| *B05B 17/06* | (2006.01) |
| *B01J 19/00* | (2006.01) |
| *B01L 3/02* | (2006.01) |
| *B41J 2/14* | (2006.01) |
| *H10N 30/20* | (2023.01) |

(52) U.S. Cl.
CPC ....... *B05B 17/0615* (2013.01); *B01J 19/0046* (2013.01); *B01L 3/0241* (2013.01); *B41J 2/14008* (2013.01); *H10N 30/20* (2023.02); *B01L 2400/0436* (2013.01)

(58) Field of Classification Search
CPC ................ B41J 2/14008; B41J 2/04575; B41J 2/04593; B41J 2/04573; B41J 2/04596; B41J 2/04; B41J 2/04541; B01J 19/0046; B05B 17/0615; B05B 17/0607; H10N 30/20; B01L 3/0241; B01L 2400/0436; B01L 2300/0829; B01L 3/5085
See application file for complete search history.

(56) References Cited

U.S. PATENT DOCUMENTS

| | | |
|---|---|---|
| 5,953,027 A | 9/1999 | Suwabe et al. |
| 6,422,685 B1 | 7/2002 | Kondo et al. |
| 6,925,856 B1 | 8/2005 | Williams |
| 2004/0112979 A1 | 6/2004 | Shrader |
| 2007/0040043 A1 | 2/2007 | Onozawa |

OTHER PUBLICATIONS

International Search Report dated Jun. 4, 2019, in International Application No. PCT/GB2019/050269; Filed: Jan. 31, 2019; Applicant: TTP PLC.
Written Opinion of the International Searching Authority dated Jun. 4, 2019, in International Application No. PCT/GB2019/050269; Filed: Jan. 31, 2019; Applicant: TTP PLC.

*Primary Examiner* — Jannelle M Lebron
(74) *Attorney, Agent, or Firm* — Erise IP, P.A.

(57) ABSTRACT

An acoustic droplet ejection apparatus comprises an acoustic actuator and a fluid well having abase and at least one side wall. The actuator is arranged to couple acoustic energy into the fluid well through the side wall.

19 Claims, 6 Drawing Sheets

Figure 1 (below):

ACOUSTIC DROPLET EJECTION

RELATED APPLICATIONS

The present application is a national stage application under 35 U.S.C. § 371 of International Application No. PCT/GB2019/050269, filed 31 Jan. 2019, which claims priority to Great Britain Patent Application No. 1801712.9, filed 2 Feb. 2018. The above referenced applications are hereby incorporated by reference into the present application in their entirety.

FIELD

This invention relates to droplet generation using ultrasonic acoustic waves, focused at the surface of a liquid. Droplets generated thus are used as a means for non-contact dispensing small volumes of liquid chemical and biological samples without the need for disposable pipette tips and with a very low risk of cross-contamination.

BACKGROUND

Acoustic droplet ejection (ADE) occurs when a burst of acoustic energy is transmitted through a liquid and focused near the surface. The principle has been applied previously as a technique for digital printing of ink, for example as described in U.S. Pat. No. 5,821,958. More recently, the method has been applied as a means of non-contact dispensing of small volumes of liquid chemical and biological samples, which avoids the risk of cross-contamination and removes the need to use disposable pipette tips. Such systems have been described in U.S. Pat. Nos. 6,666,541 and 6,596,239 and use a specialised well-plate and a moveable acoustic generator, coupled to the well plate using water.

Existing systems have several disadvantages; they are large in size, they require liquids to be formatted in a particular type of well plate, they are limited to a single drop size and hence are slow to produce a wide range of dilutions or to transfer volumes greater than 100 nL, they are limited to a single actuator, hence are slow to transfer from multiple wells, and they have a high cost of ownership.

SUMMARY

This invention describes an acoustic droplet ejection system that seeks to overcome at least some of these various disadvantages and produces various additional advantages described in the text and apparent to those skilled in the art.

It is an objective of this invention to provide an array-based acoustic droplet ejector. It is a further objective of this invention to provide an acoustic droplet ejector for use with single sample tubes. It is a further objective of this invention to provide an acoustic droplet ejector with adjustable drop size. It is a further objective of this invention to provide an acoustic droplet ejector with adjustable focus point. It is a further objective of this invention to provide an acoustic droplet ejector with mixing, separation, fragmentation, and/or thawing functions. It is a further objective of this invention to provide a well-plate with integrated acoustic droplet ejector capability. It is a further objective of this invention to provide an acoustic droplet ejector which does not require the use of a liquid couplant. It is a further objective of this invention to provide a method of driving one or more actuator elements in an acoustic droplet ejection mechanism in order to control the ejection of droplets. It is a further objective of this invention to provide a method of mixing components of a fluid and ejecting droplets from the surface of the mixed fluid using acoustic forces.

The system may be arranged such that the diameter of the droplets may be can be adjusted by a ratio of at least 3:1 by variation of frequency, focal spot size or pulse length.

The phase of the RF burst applied to different sections or rings of the actuator may be adjustable.

The frequency of the RF carrier frequency may be in the range 0.1-100 MHz or, more preferably, 1-10 MHz.

The system may be arranged such that the acoustic energy is coupled in through the side-wall of a single sample tube.

The droplets may be ejected from a sample tube with a height greater than its diameter.

The actuator may be cylindrical and may be formed into a series of rings.

The actuator may be substantially planar and may be formed into a series of rings.

There may be an array of actuators configured to align with an array of wells or a subset thereof.

The actuator array may be joined to the well array, and this may take the form of a piezoelectric polymer layer with associated electrodes.

The system may be arranged such that the motion of the fluid surface in response to a test pulse is used to determine the waveforms applied to each actuator element.

The coupling of acoustic energy into the well may be performed by a compliant solid coupling layer.

The base of the well may form part of an acoustic lens, which may be an acoustic Alvarez lens, an acoustic Fresnel lens, or a convex or concave surface.

The base of the well may incorporate an acoustic structure for matching the acoustic impedance to that of air. Similarly, for this embodiment, the actuator is air-coupled and the coupling medium is the air.

The system may incorporate additional components to provide additional mixing, separation, fragmentation or thawing functions.

The invention has many applications, and this is not an exhaustive list as further applications will be apparent to those skilled in the art. Applications include dispensing of material from sample tubes used in chemical and biological sample libraries, configuration of biological assays, dispensing between well plates for replication and reformatting, the formation of micro-arrays, monitoring of assay progress (e.g. enzyme kinetics), mass spectroscopy sample introduction, delivery of pharmaceutical or cosmetic agents, for example to the skin or eyes, and delivering of viscous materials onto substrates without mess, e.g. adhesives, coatings, paint, varnishes, functional materials, etc.

DETAILED DESCRIPTION

Figure 1:
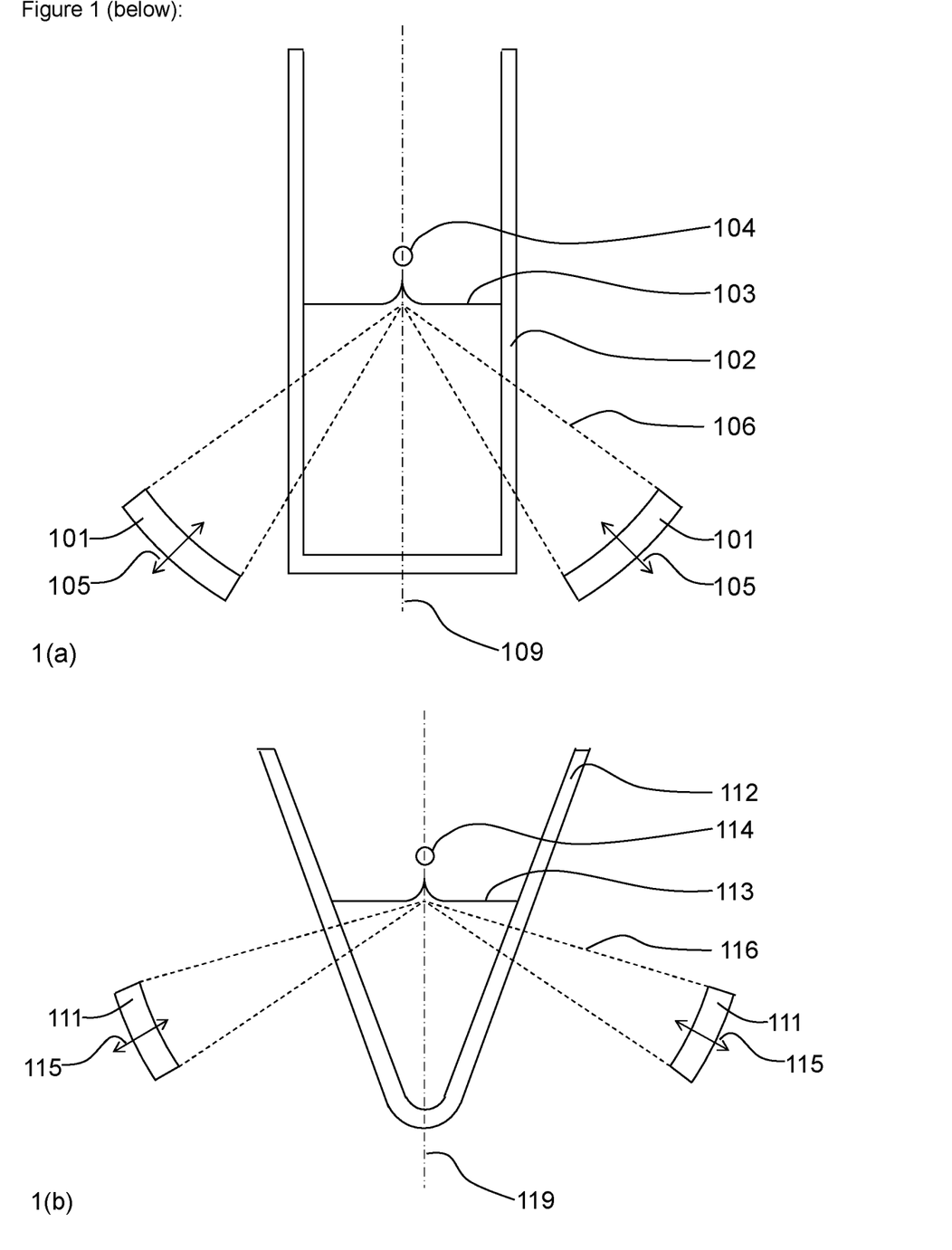
FIG. 1 illustrates ejection of droplets by transmitting acoustic energy through the wall of a sample tube.

FIG. 1(a) illustrates ejection of droplets by transmitting acoustic energy through the wall of a sample tube. The illustration is intended as axisymmetric around the centre-line 109, although it could also operate with component 109 being a symmetry plane, for example, for ejection from a rectangular-section sample tube or microchannel. An acoustic actuator 101 is shaped, in this example, as a section of a sphere (or an approximation thereto) so that rays of acoustic energy 106 perpendicular to the surface converge to a point near the surface of the liquid 103. A suitable actuator 101 is typically a piezoelectric material with electrodes on opposing faces, and is excited to vibrate in a thickness mode (shown by the arrows 105) in order to produce energy at the excitation frequency. The excitation preferably falls between 0.1 MHz and 100 MHz and more preferably falls between 1 and 10 MHz. The first thickness mode of PZT piezoelectric materials occurs when the thickness is half a wavelength, i.e. 2 mm at 1 MHz and 0.2 mm at 10 MHz. Higher order thickness modes at $3\lambda/2$, $5\lambda/2$, etc. may be used, provided the actuator is fabricated with sufficient precision. The acoustic energy passes through the sample tube 102 and is focused on the liquid surface 103, which causes the surface to rise up and eject a droplet 104. In this embodiment, the relative position of actuator 101 and tube 102 may be adjusted to maintain a focal point at the liquid surface 103, as the liquid level may vary. Ejection of a droplet typically takes of the order of a millisecond and a burst of acoustic energy is typically applied for a similar time period in order to eject a single drop. Sample tubes such as those used in pharmaceutical compound storage applications often have complex features on the base, such as 2D barcodes or RFID tags. In addition, they are often taller than they are wide (being 44 mm tall in some cases) which presents challenges for ADE technologies coupling through the base due to the long focal length required and the associated small area of the actuator. Hence it is an advantage of the example shown in FIG. 1 to be able to transmit energy through the side-walls of the sample tube to minimise the distortion of the acoustic waves due to such features. This coupling through the side-walls produces an advantage of improved compatibility with existing methodologies and equipment.

FIG. 1(b) illustrates ejection of droplets by transmitting acoustic energy through the wall of a tapered sample tube. The illustration is shown with a conical sample tube 112 and symmetry axis 119, although could similarly operate with a pyrimidal sample tube. An acoustic actuator 111 is shaped, in this example, as a section of a sphere (or an approximation thereto) so that rays of acoustic energy 116 perpendicular to the surface converge to a point near the surface of the liquid 113. A suitable actuator 111 is typically a piezoelectric material with electrodes on opposing faces, and is excited to vibrate in a thickness mode (shown by the arrows 115) in order to produce energy at the excitation frequency. The acoustic energy passes through the sample tube 112 and is focused on the liquid surface 113, which causes the surface to rise up and eject a droplet 114. In this embodiment, the relative position of axtuator 111 and tube 112 may be adjusted to maintain a focal point at the liquid surface 113, as the liquid level may vary. Advantageously, the acoustic energy (as shown by rays 116) travels substantially perpendicular to the surface of the sample tube 112, so that refraction and distortion of the acoustic wavefront are minimised. In this embodiment, a liquid or gel coupling medium 118 is used couple the acoustic energy efficiently into the sample tube 112. The actuator 111 may be shaped so that it fits in between individual sample tubes or liquid wells in an array. In such an embodiment, the actuator would be located around the particular sample tube from which fluid is to be ejected.

The size of the ejected droplet is strongly influenced by the size of the focal spot at the surface of the liquid. In order to dispense a wide range of fluid volumes, it is highly advantageous to be able to adjust the droplet size. In the case of a diffraction limited spot, the spot size is determined by the wavelength and the numerical aperture of the acoustic source. In tests using a 2 MHz curved actuator, the drop diameter was found to reduce by a factor of three when the actuator was driven at its third harmonic (i.e. at 6 MHz). Another method of modulating the drop diameter is to change the drive pulse shape. A short pulse with high intensity (60V amplitude, 300 cycles or 0.15 ms, 300 μm drop diameter) was observed to produce droplets with one third of the diameter of a longer pulse of low intensity (30V, 3000 cycles or 1.5 ms, 900 μm drop diameter). A third method of adjusting the droplet diameter is to deliberately de-focus the spot, either by moving the actuator relative to the liquid surface or by changing the relative phases of different elements of a Fresnel-type actuator. These methods may be used in combination to further extend the dynamic range of droplet sizes that can be produced.

Figure 2:
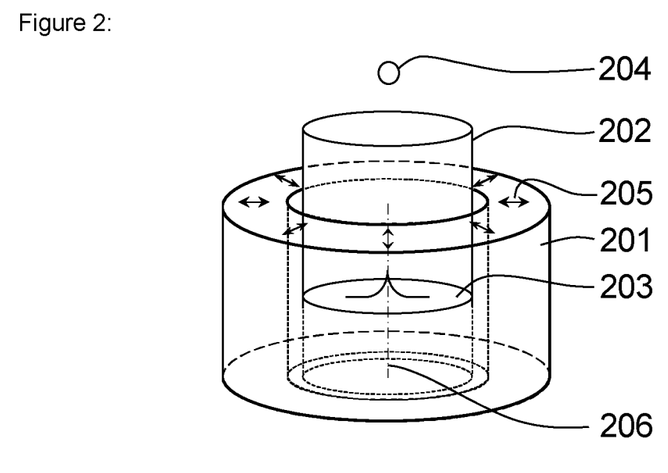
FIG. 2 illustrates an embodiment of the invention using a cylindrical actuator to focus energy to a focal line.

FIG. 2 illustrates an embodiment of the invention using a cylindrical acoustic actuator 201 to focus energy to a focal line 206. The actuator is excited to vibrate, as shown by the arrows 205, focusing energy towards a focal line 206 close to the centre line of the sample tube 202. In this embodiment, a droplet 204 is ejected from the surface, regardless of the level of the liquid surface 203. This is advantageous, as the liquid level may vary for different sample tubes or during ejection of a sequence of droplets, and we would like to be able to sample liquid from the sample tube 202 regardless of the amount remaining. The sample tube 202 and actuator 201 may be coupled by an acoustically matched material, such as water. Alternatively, the sample tube 202 and actuator 205 may be integrated into a single part (e.g. a piezoelectric sample tube).

Figure 3:
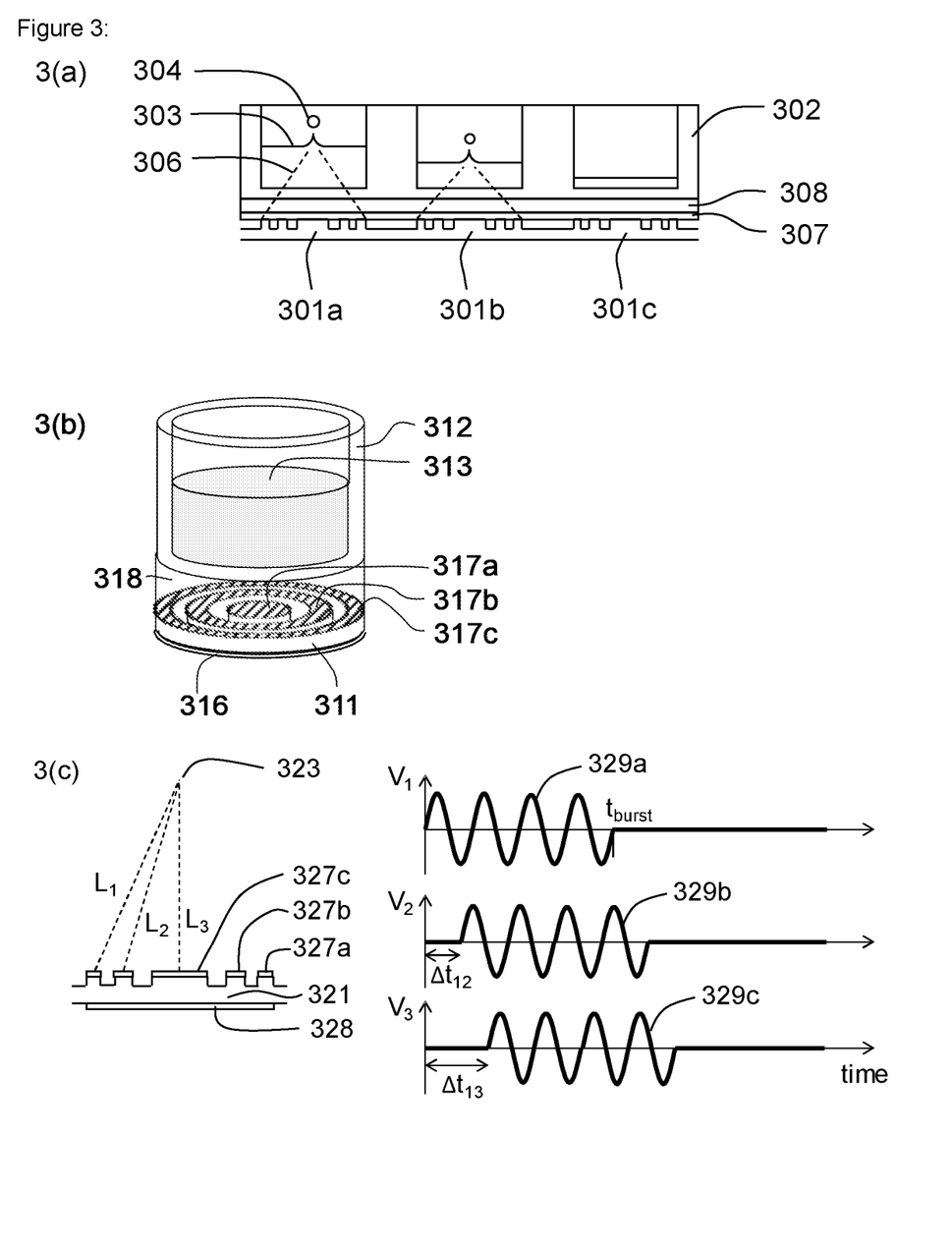
FIG. 3 illustrates an array of actuators ejecting droplets from an array of fluid wells.

FIG. 3(a) illustrates an array of actuators ejecting droplets from an array of fluid wells. The array of fluid wells forms a well-plate 302. An array of actuators 301a, 301b & 301c is located underneath the individual fluid wells. In this example, the actuators are patterned into a series of rings. This forms an actuator which is combined with an acoustic Fresnel lens. The example illustrates, although is not limited to, the use of piezoelectric actuators having a lower electrode formed on the lower surface of the actuators and an upper electrode forming electrical contact with the upper surface of the actuator in selected locations. The upper electrode may also include or function as a sealing layer 307, forming pockets of air or a different material, in order to modulate the acoustic coupling from the areas between the actuated rings. Preferably, the upper electrode/sealing layer 307 is formed from a flexi-PCB circuit attached to the upper face of the actuator array 301a-c. An acoustic coupling layer 308 is located between the upper electrode/sealing layer 307 and the well-plate 302. The acoustic coupling layer preferably takes the form of a water bath or it may be a compliant gel pad. In operation, the path (of phase) difference between the acoustic energy from different rings of the actuator is such that constructive interference occurs at a point at the liquid surface 303. This is illustrated as converging rays of focused acoustic energy 306 approaching the liquid surface 303 and causing a droplet 304 to be ejected. Advantageously, the relative phase of the signals applied to successive rings of an individual actuator (e.g. 301b) can be adjusted electronically, so as to be able to focus the acoustic energy at the surface, regardless of the liquid level (e.g. 301b compared to 301a). FIG. 3(b) shows detail of one of the fluid wells and actuators. The actuator material 311 has a lower electrode 316 and a series of electrode rings 317a, 317b and 318c. An acoustic coupling layer 318 couples the acoustic energy into the well 312 and hence into the liquid. In operation the phase of the RF burst sent to each of the electrode rings 317a, 317b and 317c can be independently adjusted in order to obtain constructive interference at the liquid surface 313 regardless of the amount of liquid in the well.

FIG. 3(c) illustrates the superposition of signals from multiple actuator elements to achieve the desired focus point. The device is illustrated with axial symmetry. The actuator 321 has multiple upper electrode elements 327a-c and a lower electrode element 328. The top of the first actuator element (i.e. the first upper electrode element 327a) has a path length L1 to the desired focal point 323. The second upper electrode element 327b has a path length L2 to the desired focal point 323. The third upper electrode element 327c has a path length L3 to the desired focal point 323. An RF burst waveform 329a of length tburst is applied to the first upper electrode 327a. A similar shaped waveform 329b is applied to the second upper electrode element 327b, delayed by a time $\Delta t12=(L1-L2)/c$ where c is the speed of sound. A third waveform 329c is applied to the third upper electrode element 327c, delayed by a time $\Delta t13=(L1-L3)/c$ where c is the speed of sound. These delays are such that the waves arrive at the desired focal point 323 with the same phase and interfere constructively, adding in amplitude. Hence, adjustment of the delays can be used to move the focal point. In practice, the waveforms are several hundred cycles long, so the relative phases of the bursts are more important than the absolute delays. In practice, phase differences can also be adjusted to account for variable geometry and acoustic properties of the intervening media between the actuator 321 and the desired focal point 323. For use as a more conventional Fresnel-type actuator, the elements can be driven with identical waveforms, so that a focal point appears where the path differences (L1−L2 and L2−L3) are integer numbers of wavelengths. This would allow the actuators to be driven with low cost electronics for applications where precise droplet volumes are not required.

Whilst piezoelectric actuation is the preferred transduction method for this and other example embodiments, alternative actuation methods are suitable, including, but not limited to, electrostrictive or magnetostrictive actuators, which might have advantages such as lower cost or contactless operation. Electrostrictive actuators have a low cost and are readily made in thin, precise layers and can be shaped to conform to a curved surface, so may be advantageous for application onto curved substrates and/or for operation at high frequencies and/or for applications where the actuator is part of a consumable element. Magnetostrictive actuators may have a low cost comsumable element, for example a ferrite disc attached to the base of each well in a well array, combined with a re-useable actuation coil. This provides an alternative way to produce a low cost consumable.

Figure 4:
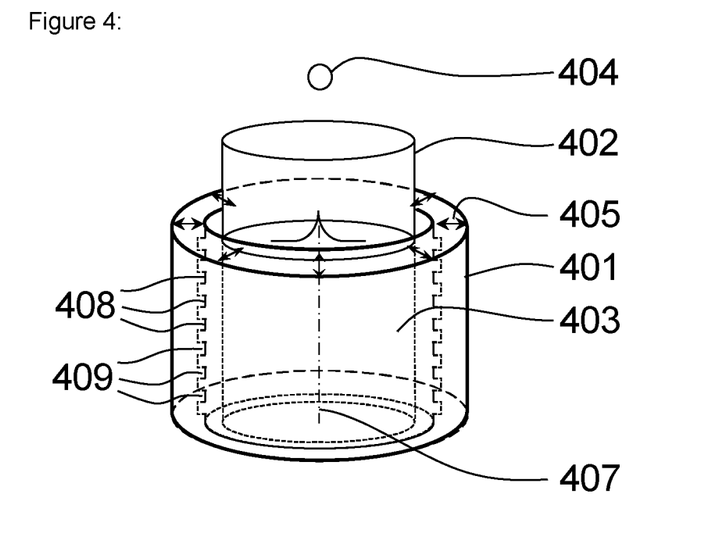
FIG. 4 illustrates ejection of droplets using a segmented cylindrical actuator.

FIG. 4 illustrates ejection of droplets using a segmented cylindrical actuator. In this embodiment, the piezoelectric acoustic actuator 401 is formed into a cylinder with a series of raised rings or pillars 409. Electrode rings 408 provide electrical contact to the raised rings on the piezoelectric material 409. In operation, a burst of RF energy is applied, causing the actuator to vibrate in a thickness-mode resonance, as illustrated by the double-headed arrows 405. Acoustic energy from the actuator naturally tends to converge along the centre-line 407. In operation, a sample tube 402 in the actuator has liquid 403 within it. The phase of the RF signals applied to the different electrode rings 408 can be adjusted in order to achieve constructive interference and hence focus the acoustic energy to a point at the surface of the liquid 403. This causes ejection of a droplet 404 from the liquid surface.

Figure 5:
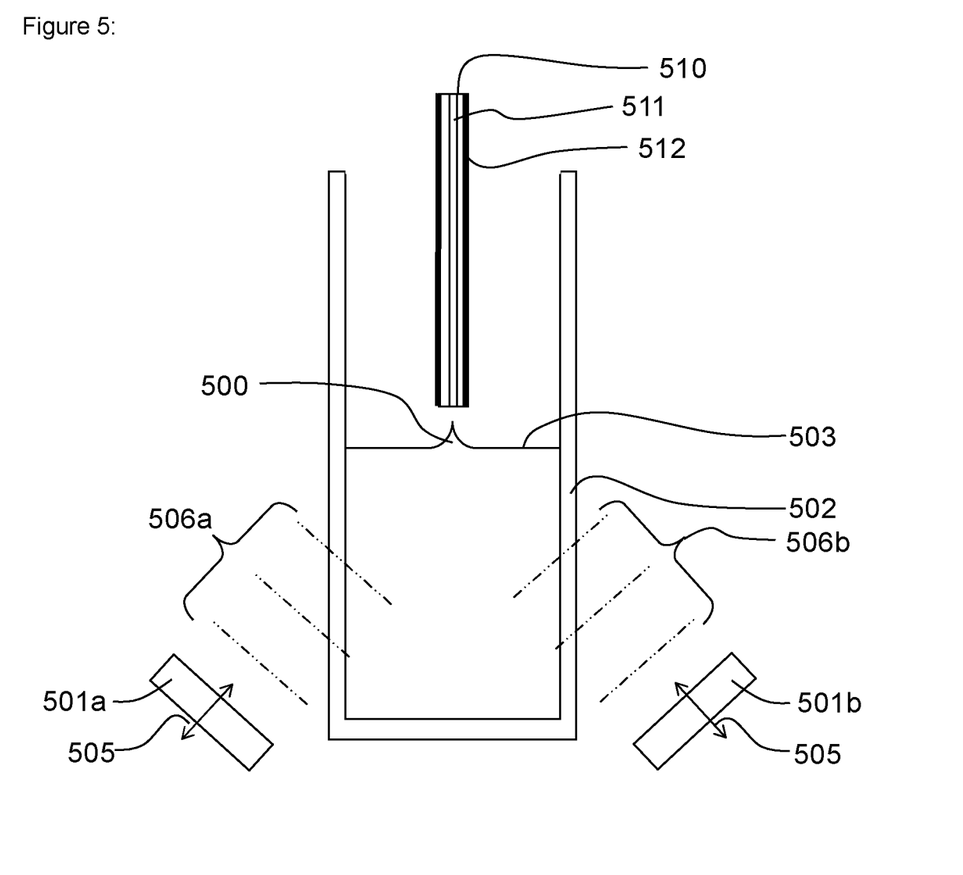
FIG. 5 illustrates the use of a surface motion sensor in combination with acoustic actuators.

FIG. 5 illustrates the use of a surface motion sensor in combination with acoustic actuators. In this embodiment a surface motion sensor 510, which might, for example, be a capacitive sensor, a photoelectric sensor, an optical imaging system or other applicable device or system, is used to measure the motion of the liquid surface 503, in order to adjust and optimise the drive signals. In the case of a photoelectric sensor, the position of the liquid surface may be determined by optical triangulation, interferometry, or laser doppler velocimetry methods. A capacitive probe is illustrated by way of example, with a central sense electrode 511 and outer shield electrode 512. In this embodiment, a plurality of actuators 501a, 501b are used to direct a burst of acoustic energy towards a point 500 on the surface of liquid 503 in a sample tube 502. The actuators 501a & 501b are illustrated as piezoelectric actuators operating in thickness mode, with the vibration illustrated by double-headed arrows 505. As previously discussed, alternative transduction techniques and methods may be substituted for piezoelectric actuation. Preferably, three or more actuators converging from different directions would be used to provide additional degrees of freedom in generating the driving waveforms. Wave-fronts 506a & 506b propagate from the actuators 501a &501b towards the liquid surface 503.

Embodiments of the present invention can be calibrated prior to use. In an example calibration process, initially, test pulses are applied and the response of the liquid surface is measured. Next, time reversal methods are applied to determine the waveforms that should be applied to focus the energy correctly in time and space in order to cause ejection of a droplet. If the surface motion sensing is performed with a probe, as illustrated in the example embodiment of FIG. 5, then the probe would be retracted following the test pulses, in order to allow free passage of the ejected droplet. This approach has several advantages. Firstly, less precise low-cost actuators and mounting can be used, as imperfections in the actuators are compensated for by the waveforms. For example, flat chips of PZT can be used, as illustrated, instead of precisely curved actuators. Secondly, imperfections in the material properties and/or geometry of the sample tube can be compensated for. Thirdly, complex geometries of obstructions or sample tubes can be accommodated by the algorithm. These last two advantages are especially important for the use of low cost, existing sample tubes, allowing non-contact ejection of droplets without the reformatting of existing sample libraries.

As will be appreciated from the above, the invention can be used in a method of acoustic droplet ejection. In such a method there are generally the steps of:
    (i) measuring motion of the liquid surface due to a signal applied to each of a number of actuator elements;
    (ii) using time-reversal methods to generate a drive waveform suitable for focusing a droplet ejection; and (iii) driving the actuator elements with the generated waveform to eject a droplet.

Figure 6:
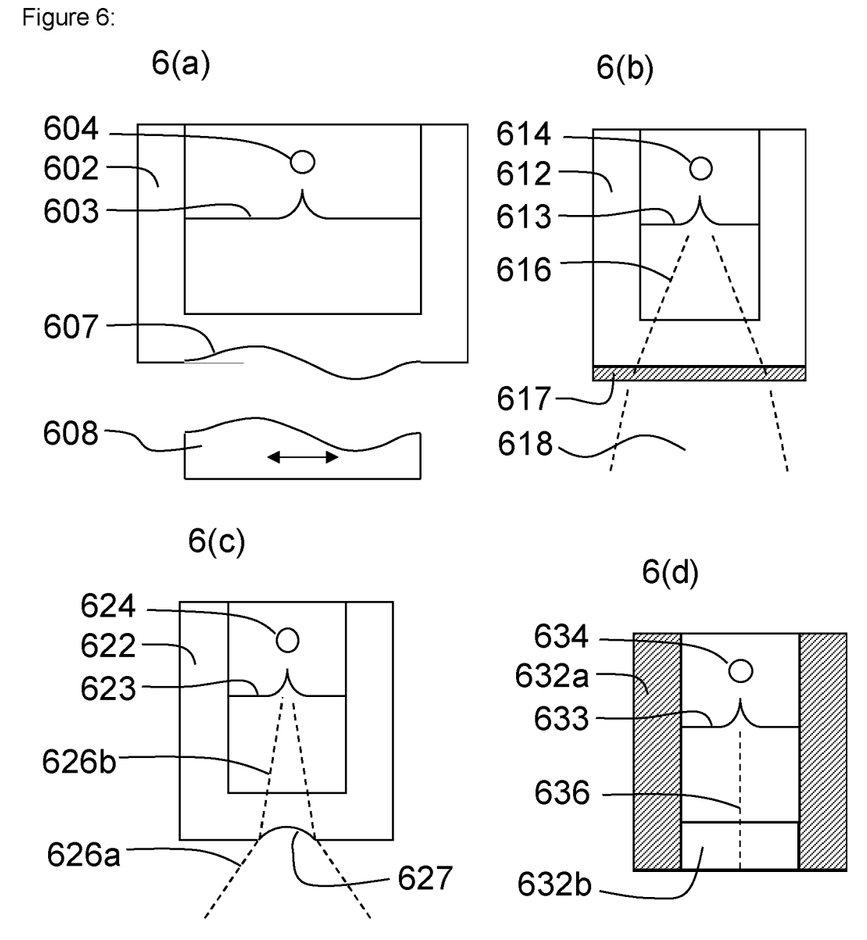
FIG. 6 illustrates embodiments of the invention with acoustically active features within the well or well array.

FIG. 6 illustrates embodiments of the invention with acoustically active features within the well or well array. FIG. 6(a) shows an embodiment of the invention incorporating an acoustic Alvarez lens. In this embodiment, the fluid well 602 has a profiled base 607. Another profiled part 608 is located between the actuator (not shown) and the fluid well 602. The two profiled parts together form an acoustic Alvarez lens, such that lateral motion of the lower part 608 relative to the base of the well 607, as depicted by the arrow in FIG. 6(a), changes the acoustic focal length, and allows energy to be focused at the liquid surface 603 and ejection of a droplet 604, regardless of the liquid fill level. This has the advantage that focusing can be achieved using only a lateral motion of a part, instead of the more usual vertical motion. This is of particular benefit when ejecting droplets from an array of wells, allowing use of a 1D or 2D array of actuators and lateral movement either of acoustic lenses or of the whole lens-actuator assembly.

FIG. 6(b) illustrates an embodiment of the invention using air-coupled acoustic actuation. This arrangement has the advantage that no liquid or gel coupling layer is required. Acoustic energy is transmitted through the air 618 and reaches an acoustic matching layer 617 on the bottom of the well 612, which is configured to minimise reflections. Several approaches for matching layers are possible here, for example a quarter-wavelength thick layer of acoustic impedance between that of the air and the well 612. Alternatively, a graded index or a moth-eye antireflection structure might be used for the matching layer 617. Alternatively, resonant mass-spring structures might be used, for example a double layer structure of metal on a soft polymer, an array of resonant "drum-skins", or an array of holes in a plate (matched to an integral number of half-wavelengths in length). In an example of this embodiment, the matching layer 617 comprises an arrangement of a 9 μm thick copper film, forming an array of 130 μm diameter "drum-skins" and supported in other areas by a polyimide film. This provides some matching at around 4 MHz and is consistent with low cost manufacturing processes. Alternative matching structures could also be used. The acoustic energy can then be focused 616 to a point on the liquid surface 613, resulting in droplet ejection 614. This arrangement also has the advantage that it can be used in combination with an air-coupled electrostatic ultrasonic transducer. These electrostatic transducers tend to be more easily produced in arrays and can achieve broadband operation. In a small well, the liquid surface tension is sufficient to allow the well to be inverted, and in this embodiment, the absence of a liquid couplant enables operation of the acoustic droplet ejection in any orientation. This is advantageous for ease of integration with existing robotic sample handling systems.

FIG. 6(c) shows an embodiment of the invention using an acoustic lens 627 incorporated into the fluid well 622. The acoustic lens 627 collects energy from an acoustic actuator (not shown), shown as the incoming rays 626a and forms a low numerical aperture source in the base of the well 622. This results in quite collimated acoustic energy (as shown by the rays 626b), providing a long depth-of-focus in the liquid, and operation over a range of liquid levels. The converged energy deflects the liquid surface 623 ejecting a droplet 624.

FIG. 6(d) shows an embodiment where the well 632a&b is configured to act as an acoustic waveguide. Acoustic energy entering through the base of the well 632b is confined by walls of the well 632a and travels up to the liquid surface 633 resulting in droplet ejection 634. The walls of the well 632a have an acoustic impedance that is mis-matched to the fluid, resulting in the acoustic energy being confined within the well. This approach is advantageous as the acoustic energy remains concentrated along the centre line 636 and droplet ejection can be achieved independently of liquid level.

With the invention an acoustic well plate may be formed as an array comprising a plurality of wells as exemplified in FIG. 6, arranged for example such that the bases of at least some of the wells form acoustic lenses. An air-matched layer associated with at least one of the wells may optionally be incorporated into the base of the well-plate, as illustrated in FIG. 6(b).

Figure 7:
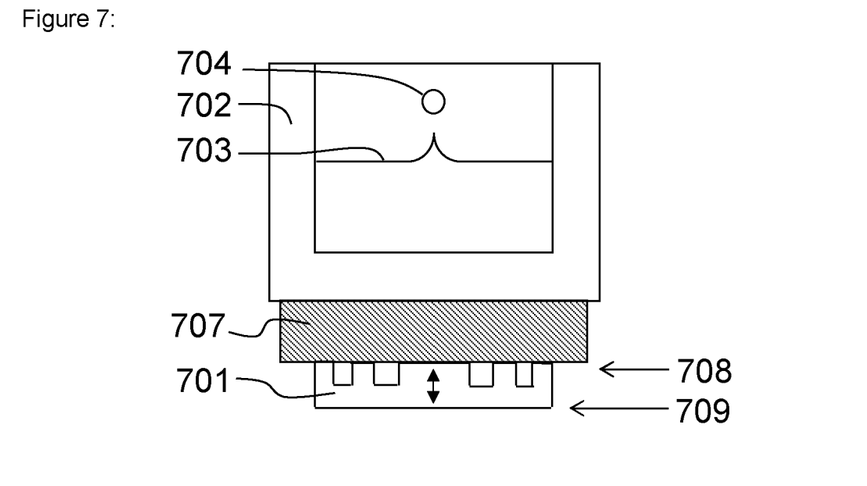
FIG. 7 illustrates an embodiment of the invention using a compliant coupling layer.

FIG. 7 illustrates an embodiment of the invention using a compliant coupling layer. An actuator 701 is driven by a voltage between an upper electrode 708 and a lower electrode 709. The actuator 701 is formed into rings, for example by micro-milling or laser machining, or by patterned deposition. These rings form an acoustic Fresnel lens, allowing energy to be focused, rather than being transmitted in a diverging beam. Advantageously, the individual rings on the actuator may be driven with RF bursts with different phase lags, in order to adjust the focal length to match the liquid level. The flat actuator is then coupled to a well 702 using a compliant matching layer 707. This may be gel-like layer, such as an ultrasound gel pad used in ultrasound imaging applications. Being a non-liquid couplant, it has the advantage that no residue is left on the well 702 or well array when it is removed from the actuator. Energy coupled into the well by the compliant matching layer 707 is focused to a point at the liquid surface 703, causing ejection of a droplet 704. Advantageously, this embodiment can operate in any orientation, which is advantageous for integration into existing equipment and workflows and is substantially more difficult to achieve when using a liquid couplant.

Figure 8:
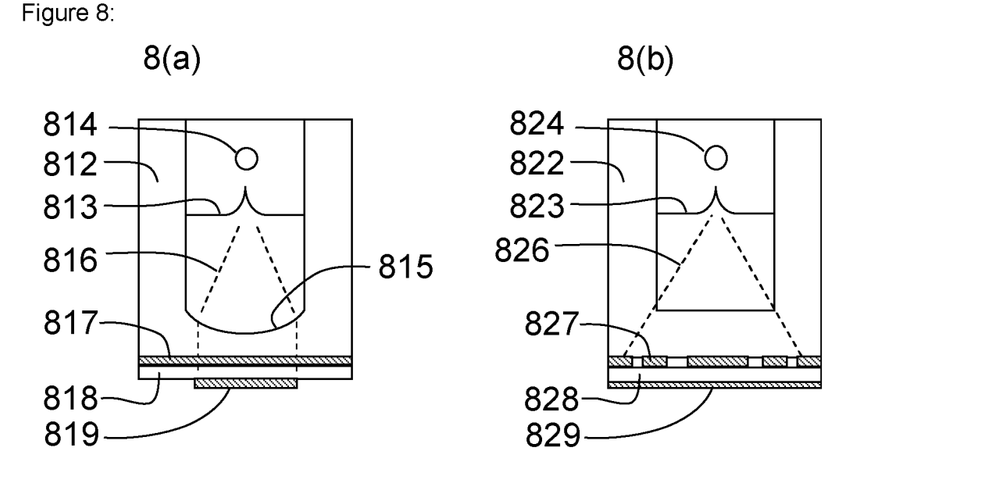
FIG. 8 illustrates embodiments of the invention incorporating the actuator into the well or well array.

FIG. 8 illustrates embodiments of the invention incorporating the actuator into the well or well array. FIG. 8(a) illustrates a well 812, incorporating a flat actuator 818 and a curved well bottom 815. The actuator is driven by a burst of RF energy in the form of a voltage between the upper electrode 817 and the lower electrode 819. The resulting burst of acoustic energy is focused by the curved well bottom 815, as illustrated by the rays shown as dotted lines 816. Upon reaching a point on the liquid surface 813, a droplet 814 is ejected.

The fluid well and actuator may be part of a well and actuator array. Using a continuous upper electrode 817 has advantages for straightforward fabrication of the device. The actuator could be a piezoelectric polymer such as PVDF. This has the advantage of low cost, allowing the well or well-plate assembly to be a consumable item.

FIG. 8(b) illustrates a well 822 with a piezoelectric layer 828 and upper 827 and lower 829 electrodes. The upper electrodes 827 are shown patterned into rings, to allow different regions to be excited with different phases, creating an acoustic Fresnel lens, which focusses acoustic energy (illustrated by rays 826) at the liquid surface 823 causing ejection of a droplet 824. The well 822 and piezoelectric and electrode structure is permanently bonded together. A low cost polymer piezoelectric, such as PVDF or PVDF-TrFE, is preferred in order to make the well or well-plate a disposable item with low manufactured cost. Advantageously, this embodiment can operate in any orientation, which is advantageous for integration into existing equipment and workflows and is substantially more difficult to achieve when using a liquid couplant.

Combinations of wells and actuators, as exemplified in FIG. 8, may be formed as an array comprising a plurality of such wells and actuators in a well-plate, arranged such that a piezoelectric layer is included in the base of the well-plate.

Figure 9:
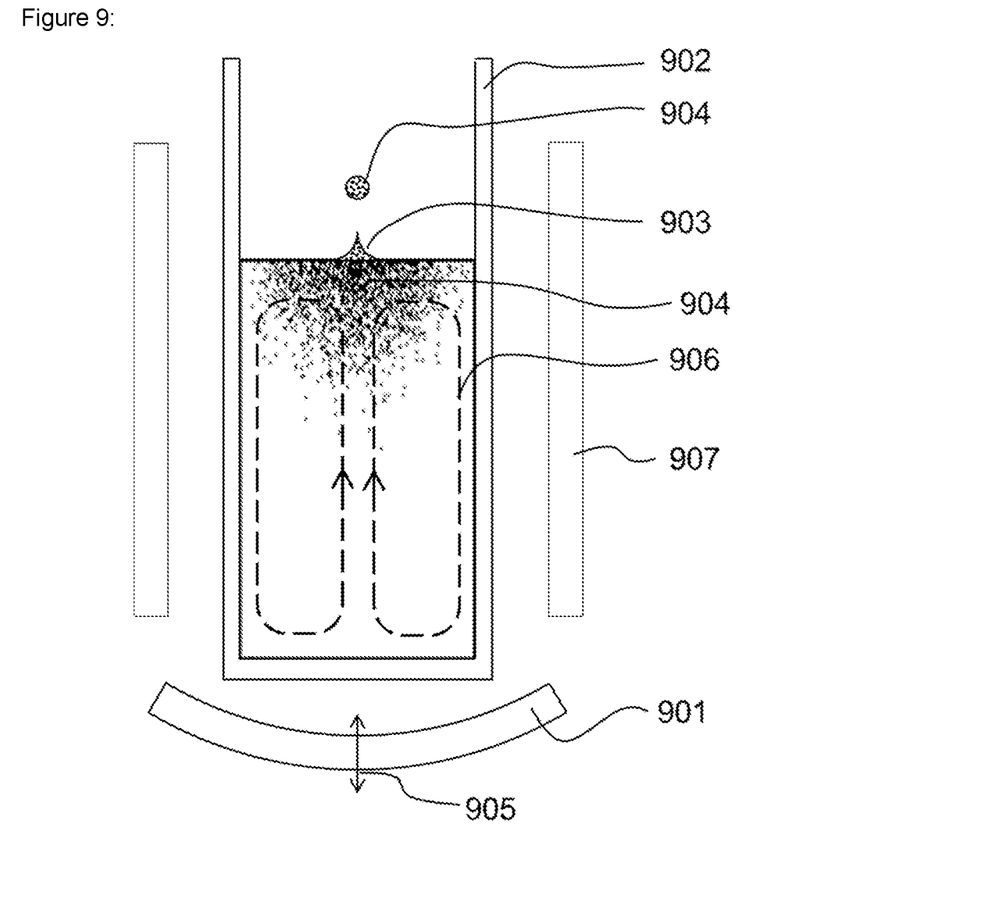
FIG. 9 illustrates embodiments of the invention with multi-modal operation.

FIG. 9 illustrates embodiments of the invention with multi-modal operation. In this embodiment of the invention, other acoustically-driven processes are conducted in addition to acoustic droplet ejection. It is often advantageous to include processes such as mixing of samples or selective sampling of certain components of a mixture within a process flow. It is advantageous to provide one piece of equipment that can perform multiple functions in order to perform processing rapidly and at low cost. The embodiment has a sample tube or well 902 which contains liquid, acoustically coupled to an actuator 901, shown here as a spherical piezoelectric actuator. Optionally, additional actuator or actuators 907 may be included, optimised for different processes. A cylindrical actuator is illustrated in this example 907. In operation, sample mixing by acoustic streaming can be achieved by driving the actuator 901 in short bursts of high energy. Typical flow cells for acoustic streaming are shown by the dashed lines 906. Some components of a mixture may need to be separated out, for example polymer beads, cells or micro-drops. Acoustic energy is applied in a standing wave mode of the liquid in order to concentrate one component at nodes or anti-nodes. Use of an additional actuator 907 may be beneficial to excite particular modes in some applications. The concentration of particles is illustrated by the dark spots in the liquid, showing a high concentration region 904 just below the liquid surface 903 in this example. In operation, a component of the fluid is concentrated either close to or away from the region from where the droplet is to be ejected, in order to selectively dispense this component or to avoid dispensing it. Following concentration, a droplet ejection pulse waveform is applied to the actuator 901, which vibrates in thickness mode 905 and causes ejection of a droplet 904 with corresponding increased (or reduced) concentration of the component of interest. Concentration in particular regions can be achieved through combinations of acoustic radiation forces (ARF) (i.e. standing waves), streaming forces, Bjerknes forces and/or surface capillary waves. Other acoustically-driven processes may also be included in the device functionality, examples of which include, but are not limited to, emulsion generation, cell lysis, cell transfection, DNA fragmentation, and thawing. A permanent magnet or electromagnet may be included to enable concentration of magnetic beads either at the surface or at the bottom of the well. An example application such separation and dispense steps is in the ethanol wash steps in sample preparation for DNA sequencing, wherein ethanol is added to DNA in a well and separation and acoustic dispense can subsequently be used to remove the majority of the ethanol without the need for a large number of consumable pipette tips.

As will be appreciated this invention is therefore suitable for use in a method of acoustic droplet ejection which generally comprises:
(i) separating or mixing components of a fluid using acoustic forces; and
(ii) ejecting a droplet from the surface of the fluid.

Tests were conducted using a curved 2 MHz thickness-mode actuator, liquid-coupled to a well from a standard 96-well plate. Acoustic streaming is a non-linear phenomenon, which can provide moderately gentle mixing. Driving an actuator with very high amplitude for a short generation tends to favour such non-linear effects, whilst not allowing enough time for acoustic droplet ejection (ADE) to occur. Driving at 100V amplitude with a 2.5 μs burst length every 100 μs (i.e. 10 kHz repeat rate) was found to produce a strong acoustic streaming mixing effect. Driving with bursts with low enough energy not to cause ADE and a repeat can be used to excite surface capillary waves in the liquid. This provides vigorous mixing of the liquid, at least near the surface. Driving at 15V with a 0.1 ms burst length and repeat rates from 10-100 Hz were found to provide vigorous mixing. Driving in continuous mode below the threshold for droplet ejection was found to excite standing waves. Acoustic standing waves have a particular tendency to cause particles with high stiffness and density to migrate to pressure nodes due to the acoustic radiation force (ARF). Driving continuously at 10V was found to separate out high density particles. Driving at 30V with a 0.1 ms burst length and repeat rate of 1-10 Hz was found to drive ADE. Moving the focal point of the actuator to a point below the liquid surface was found to reduce accidental ADE when attempting to mix or form standing waves.

The invention claimed is:

1. An acoustic droplet ejection apparatus for ejecting droplets, the apparatus comprising:
an acoustic actuator; and
a fluid well having a base and at least one side wall,
wherein the actuator is arranged to couple acoustic energy into the fluid well through the side wall,
wherein adjusting a position of the actuator relative to a surface of a fluid contained in the fluid well adjusts a size of a focal point of the actuator to thereby adjust a droplet size.

2. The apparatus according to claim 1,
wherein the actuator is a piezoelectric element operating in thickness mode; and further comprising a control means arranged to control the actuator such that the size of the ejected droplets is adjustable.

3. The apparatus according to claim 2, further comprising an associated driver,
wherein the actuator comprises of several different parts, and the driver is arranged such that a phase of a drive waveform sent to the different parts of the actuator is adjustable.

4. The apparatus according to claim 3, further comprising means for detecting motion of a fluid surface within the well and means for configuring the drive waveforms for the actuator based on the detected motion.

5. The apparatus according to claim 1,
wherein acoustic energy is coupled into the well through a side wall of the fluid well.

6. The apparatus according to claim 1,
wherein the actuator is shaped to form part of a spherical shell.

7. The apparatus according to claim 1,
wherein the actuator is cylindrical.

8. The apparatus according to claim 1,
wherein the actuator is substantially planar.

9. The apparatus according to claim 1,
wherein the actuator is formed from a series of rings.

10. The apparatus according to claim 9,
wherein the actuator is coupled to the well by a compliant coupling layer.

11. The apparatus according to claim 10,
wherein additional mixing, separation, fragmentation or thawing functions are incorporated.

12. The apparatus according to claim 1, further comprising an array of fluid wells and an array of actuators configured to align with the array of wells or a sub-set thereof.

13. The apparatus according to claim 12, wherein the actuator array is joined to the well array.

14. The apparatus according to claim 1, wherein the actuator is arranged to be driven either at its first thickness mode or at an odd harmonic thereof.

15. The apparatus according to claim 1, wherein the fluid well has a base which forms an acoustic lens.

16. The apparatus according to claim 1, wherein adjusting a numerical aperture of the actuator adjusts the size of the focal point to thereby adjust the droplet size.

17. A liquid handling workstation comprising the acoustic droplet ejection apparatus of claim 1.

18. An analytical system comprising the acoustic droplet ejection apparatus of claim 1.

19. A medical diagnostic device comprising the acoustic droplet ejection apparatus of claim 1.

\* \* \* \* \*